United States Patent [19]

Davis, Jr.

[11] 3,961,415

[45] June 8, 1976

[54] CARRIER FOR MOUNTING A SEMICONDUCTOR CHIP AND METHOD THEREFOR

[75] Inventor: John M. Davis, Jr., Torrance, Calif.

[73] Assignee: Hughes Aircraft Company, Culver City, Calif.

[22] Filed: Jan. 2, 1975

[21] Appl. No.: 538,059

[52] U.S. Cl. ............................ 29/591; 29/589; 357/80; 174/52 R
[51] Int. Cl.[2] .................................... B01J 17/00
[58] Field of Search ............... 29/576 S, 588, 589, 29/591

[56] References Cited
UNITED STATES PATENTS 3,271,507  9/1966  Elliot .............................. 29/576 S
3,577,633  5/1971  Homma .......................... 29/576 S

*Primary Examiner*—W. Tupman
*Attorney, Agent, or Firm*—Lewis B. Sternfels; W. H. MacAllister

[57] ABSTRACT

An assembly and method for mounting a transistor chip on a carrier with lead attachment allows a circuit to approach the limitations of the transistor chip rather than to be limited by the transistor package and attached leads. The carrier is provided with a groove into which the transistor chip is placed so that the surface thereof defining the emitter is flush with a surface of the carrier. A wide but short ribbon lead is bonded from the emitter to the adjustment flush surface of the carrier so that both the characteristic impedance and the wire length are decreased to minimize the value of emitter inductance.

2 Claims, 6 Drawing Figures

CARRIER FOR MOUNTING A SEMICONDUCTOR CHIP AND METHOD THEREFOR

BACKGROUND OF THE INVENTION

1. Field of the Invention

The present invention relates to a carrier for mounting a semiconductor chip and, in particular, a type of lead attachment for allowing the circuit to approach the limitations of the semiconductor chip rather than being limited by the semiconductor package and its attached leads.

2. Description of the Prior Art

Present methods of mounting high frequency transistor chips and the like for use as amplifier limiters, microwave transistors, mixer and limiter diodes, computer switching devices, microwave amplifiers for x-band applications, and FETS, may be said to fall into three general groups comprising a direct mounted chip, flip chip, and packaged transistor. In each case, the chip is bonded to a desired location either on a transistor package or in a circuit. Then wires are attached to the chip for emitter and base connections. These wires are then connected to another point which may be a circuit element or leads emanating from the transistor package.

In the past, it has been recognized that one problem of high frequency transistor assemblies is a lead inductance of the emitter. To help solve this problem, transistor manufacturers have made wide ribbon leads from the transistor package to outside circuits. The wires that connect the transistor chip to these ribbon leads, however, has received little attention from the aspect of introducing unwanted inductance.

For example, for a wire which is short compared to a wavelength, the wire inductance can be computed by the equation $L = ZA/C$, where $L$ is the inductance, $A$ is the wire length, $Z$ is the characteristic impedance of the system, and $C$ is the velocity of light in the medium. For a typical transistor, $A = 0.024$ inches and $Z = 300$ ohms to provide an inductance $L = 0.5$ nanohenrys. For an application in a microwave transistor, a typical frequency is 7 GHz. At this frequency, the inductive reactance of each emitter lead is 25 ohms to provide a total emitter impedance of 12.5 ohms because each emitter lead is connected in parallel. The effect of this feedback impedance can be evaluated by assuming intrinsic chip transistor to be capable of 6 db of gain at 7 GHz. This corresponds to a voltage gain of 2 if the source and load impedances are equal.

A method of computing the result of emitter feedback may be provided by the formula $GV = G/[G(K/L)+1]$, where $GV$ is the resultant voltage gain, $G$ is the intrinsic voltage gain, $K$ is the emitter impedance, and $L$ is the load impedance. If the load impedance $L = 50$ ohms, then the resultant voltage gain will be 1.33, which is a power gain of 2.5 db, that is, the wire leads from the transistor chip to the package leads cause a 3.5 db decrease in maximum available gain. Such a decrease in gain results in the transistor package and attached leads being as important as the limitations of the transistor chip.

SUMMARY OF THE INVENTION

The present invention overcomes this and other problems by providing means and method by which the characteristic impedance and the length of wire attached to the emitter are decreased in order to reduce the emitter inductance to a reasonably small value so as to allow a circuit involving the transistor chip to approach the limitations of the transistor chip itself rather than by the transistor package and its attached leads. The chip is mounted on a carrier and preferably in a recess therein with leads attaching the transistor emitter to the carrier in which the leads have a short length and wide cross-section.

It is, therefore, an object of the present invention to minimize emitter inductance of a semiconductor chip package.

Another object is to provide a simple means and method for accomplishing minimized emitter inductance.

Other aims and objects as well as a more complete understanding of the present invention will appear from the following explanation of an exemplary embodiment and the accompanying drawings thereof.

DESCRIPTION OF THE PREFERRED EMBODIMENT

Figure 1:
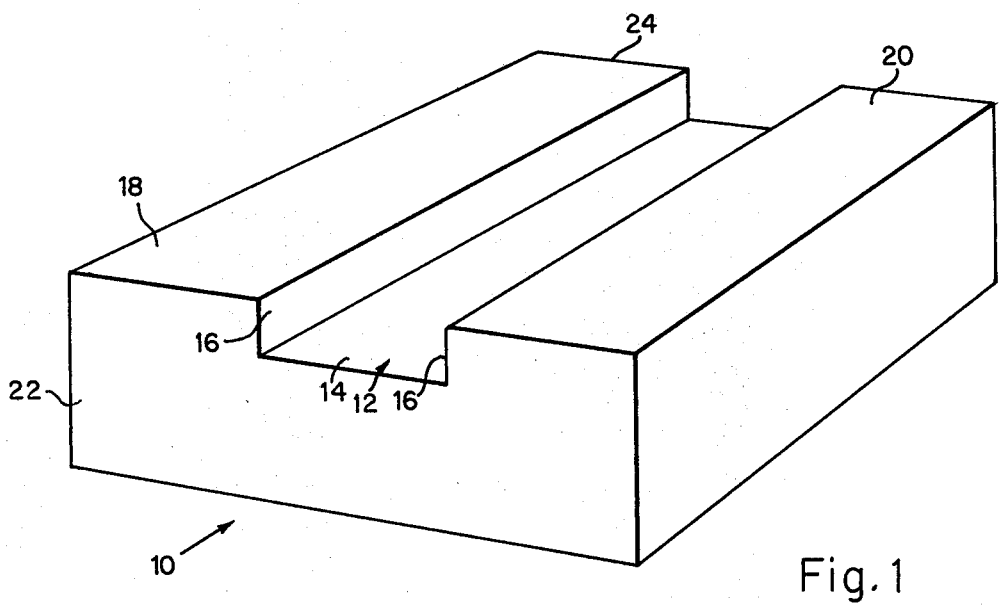
FIG. 1 illustrates a carrier with a groove provided therein.

Accordingly, referring to FIG. 1, a carrier 10 comprises a ceramic insulating material, such as of alumina, quartz and sapphire. It has therein a groove 12 comprising a bottom 14 and side walls 16. Groove 12 may be formed within carrier 10 in any suitable manner, such as by grinding. In this configuration, carrier 10 is provided with three surfaces 18, 20 and bottom 14. Groove 12 is machined sufficiently accurately so as to be as close to the height of a transistor chip and as wide as the chip width as is possible. Thereafter, carrier 10 is metallized, for example, with a 200 angstrom chromium layer followed with a 5,000 to 10,000 angstrom gold layer on its surfaces 14, 18 and 20. End surfaces 22 and 24 as well as side walls 16 are maintained free of metallization. Metallization may be effected by any convenient manner, such as by vacuum deposition.

Figure 2:
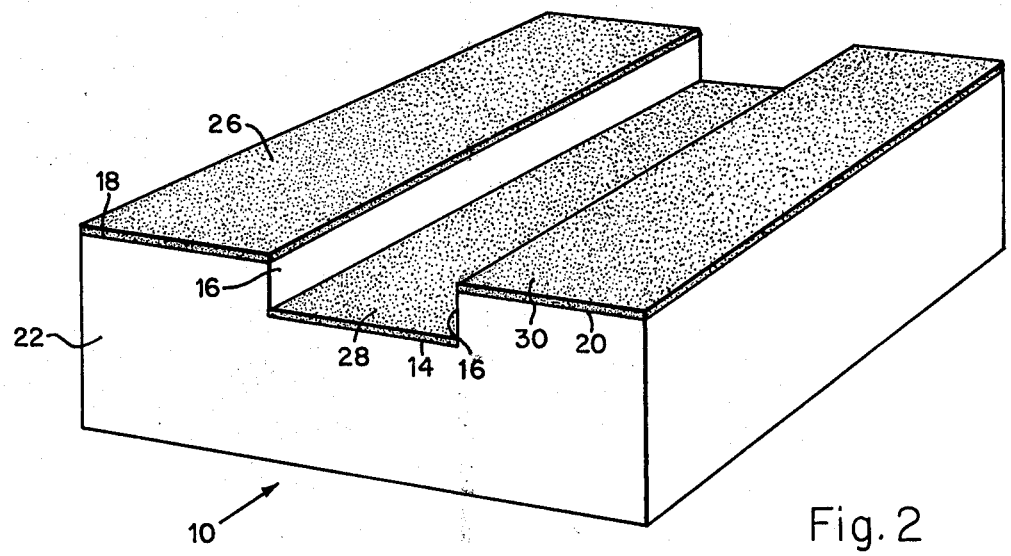
FIG. 2 shows the upper surfaces of the carrier and the groove metalized.
Figure 3:
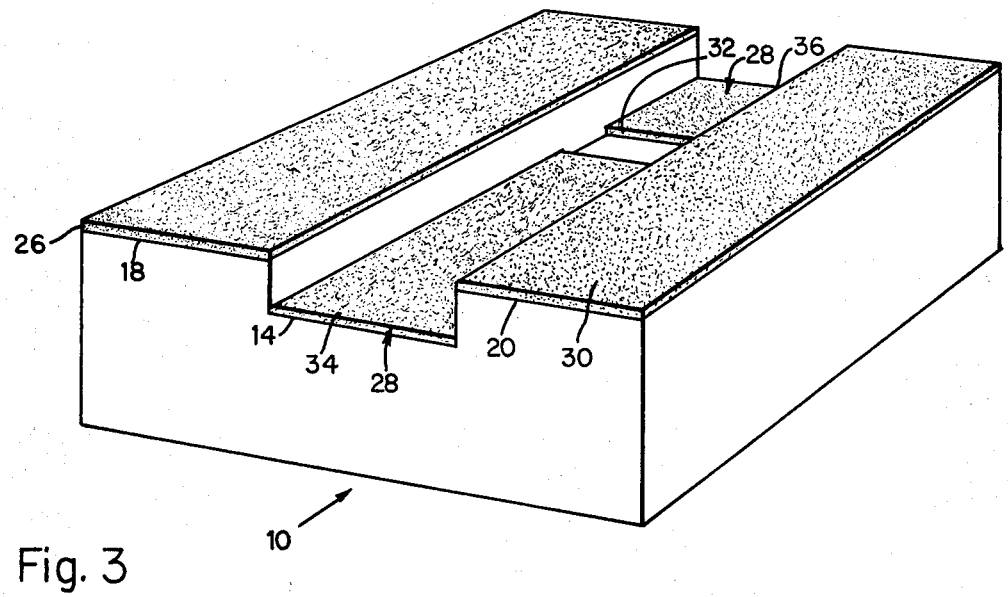
FIG. 3 shows the metalized surfaces being configured in a specific pattern.

The results of metallization is shown in FIG. 2 in which metallization layers 26, 28 and 30 are shown respectively on surfaces 18, 14 and 20. Thereafter, surface 28 is further processed to remove a portion of the previously deposited material to form a slot 32, as illustrated in FIG. 3, thereby separating metallization layer 28 into two distinct layer portions 34 and 36. Slot 32 may be provided by any suitable manner such as by photo-etching.

Figure 4:
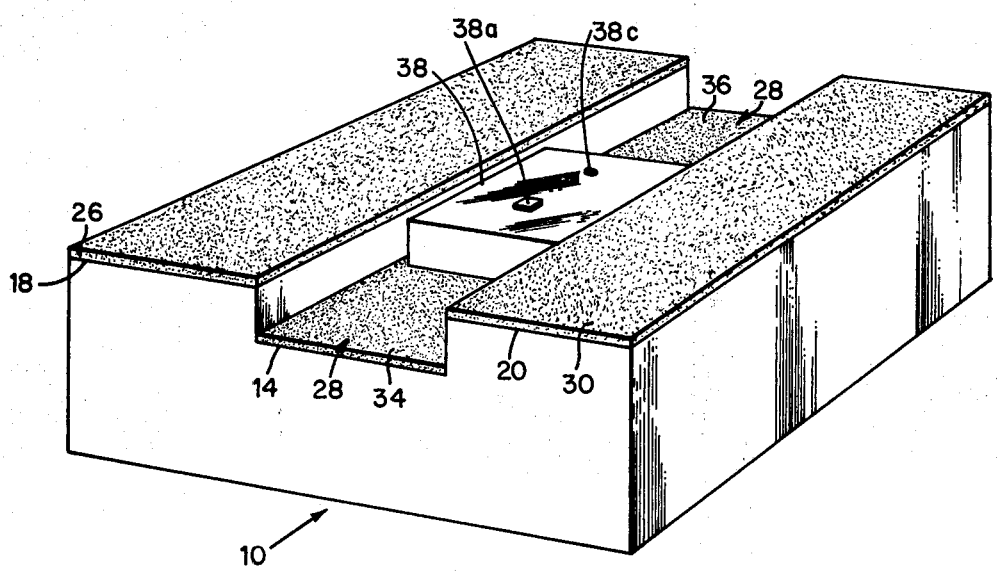
FIG. 4 shows a semiconductor chip placed within the groove and attached to the carrier.

As shown in FIG. 4, a semiconductor chip 38 is then laid on layer portion 34. Chip 38 has, for example, an emitter pad 38a, a collector pad 38b (see also FIG. 6), and a base pad 38c. Preferably, the chip is bonded at its collector pad 38b to layer portion 34 by die bonding by first heating and placing a drop of solder on layer portion 34 and then placing the chip thereon followed by the die bonding operation.

Figure 5:
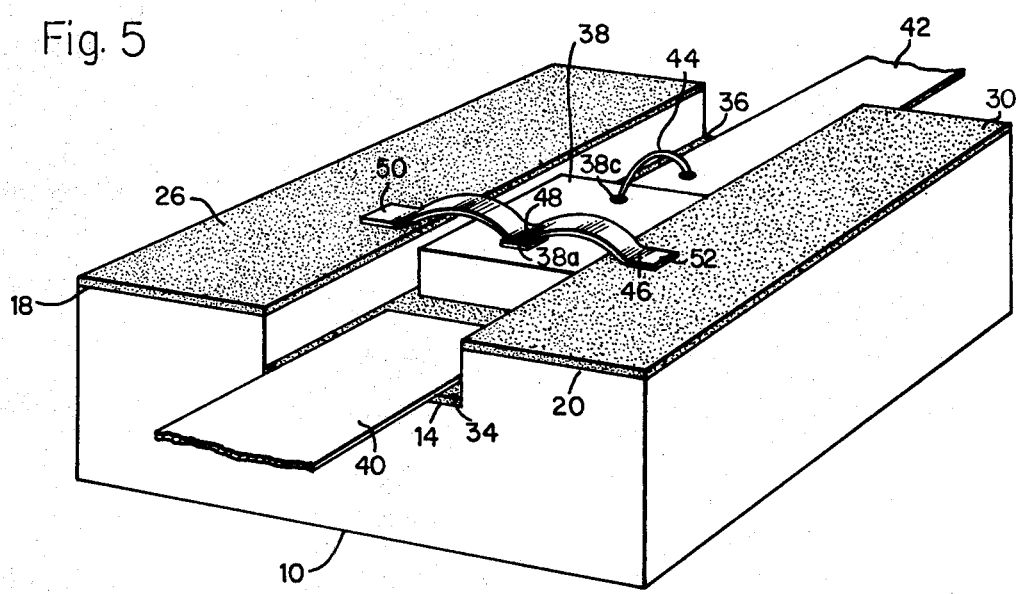
FIG. 5 shows various connections made from the chip to leads secured to the metalized surfaces.

As shown in FIG. 5, silver or gold ribbon leads 40 and 42 are then electrically coupled to metallized layer portions 34 and 36 respectively within slot or groove 12, such as by spot welding by an automatic welder, ribbon 40 providing a connection to collector pad 38b through layer portion 34. A lead 44 is secured between base pad 38c and ribbon lead 42. A bar or ribbon 46 of gold is then placed across the slot and welded at 48 to emitter pad 38a of chip 38 and at its ends at 50 and 52 to metalllize layers 26 and 30 to complete the package.

By using wide straps, especially for connection to emitter pad 38a, a low characteristic impedance connection to the emitter is made.

Figure 6:
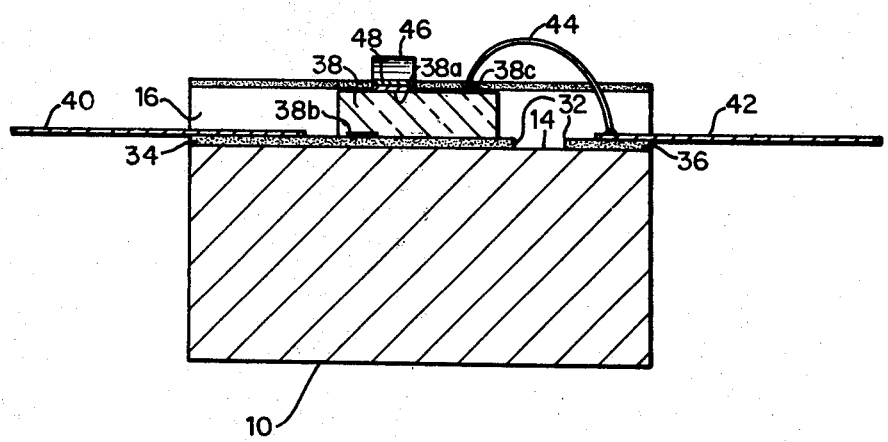
FIG. 6 is a side elevational view in cross section taken along the length of the groove for the completed device depicted in FIG. 5.

A number of transistor chips in a typical prior art package was used for amplifiers at the range of 7 GHz to 7.5 GHz. The highest gain observed for such chips was 2.3 db. When chips of a similar type were mounted according to the teachings of the present invention, such as shown in FIGS. 5 and 6, gains as high as 4.9 db in the 7 GHz to 7.5 GHz range were measured. Thus, use of the present invention provided a significant increase in gain.

Although the invention has been described with reference to a particular embodiment thereof, it should be realized that various changes and modifications may be made therein without departing from the spirit and scope of the invention.

What is claimed is:

1. A method for mounting a transistor chip of specified height and width having at least an emitter, a collector and a base, and for providing minimum emitter inductance of the transistor chip, comprising the steps of:
    selecting a carrier of insulating material having a top surface for later mounting thereon of the transistor chip;
    precisely forming means for defining a groove having a bottom and walls in the carrier and for defining a groove depth and width substantially equal to the specified height and width of the transistor chip, thereby for ensuring that the transistor chip and carrier top surface will be substantially coplanar when the transistor chip is mounted on the carrier and wherein the top surface is divided into two spaced portions by the groove means;
    metallizing only the top surface and the groove bottom of the carrier for defining contact areas for emitter, collector and base leads with means for defining an unmetallized portion in the bottom of the groove means extending between the walls thereof and thereby for defining separate contact areas for base and collector leads;
    placing the transistor chip in the groove means thereof and bonding the transistor chip and its collector to the collector lead contact area;
    bonding ribbon leads respectively to the separate contact areas in the bottom of the groove means for forming the base and collector leads;
    bonding a lead between the base of the transistor chip and the base lead;
    laying a ribbon lead having a center portion on the emitter of the transistor chip and having end portions on the metallized top surface portions for defining a pair of the emitter leads, with the ribbon lead center portion overlaying the transistor chip emitter and with the ribbon lead end portions overlaying the emitter leads; and
    bonding the ribbon lead end portions and center portion to their respective metallized emitter leads and transistor chip emitter.

2. A method as in claim 1 further including the step of maximizing the width and minimizing the length of the emitter ribbon lead for decreasing the characteristic impedance thereof and, consequently, for providing the minimum emitter inductance in accordance with the relationship $L = ZA/C$, where $L$ is the inductance, $A$ is the length, $Z$ is the characteristic impedance, and $C$ is the velocity of light in the medium.

* * * * *